FORMATION OF METALLIC CONTACTS

Filed Sept. 28, 1964

United States Patent Office 3,386,894
Patented June 4, 1968

3,386,894
FORMATION OF METALLIC CONTACTS
Christian Heinrich Maximilian Steppat, Ottawa, Ontario, Canada, assignor to Northern Electric Company Limited, Montreal, Quebec, Canada
Filed Sept. 28, 1964, Ser. No. 399,923
11 Claims. (Cl. 204—15)

ABSTRACT OF THE DISCLOSURE

On a carrier material an electrically conducting primary layer, e.g. consisting of a first sub-layer of titanium and a second sub-layer of silver, is applied and this layer is masked, e.g. by a photo-resist, except for that area at which the contact is to be provided. The contact material, e.g. gold, is then deposited on that area. After removal of the mask, the primary layer is destroyed by a step comprising etching away part of this layer and converting the remainder into an electrically non-conducting layer. During this last step, the contact material prevents the portion of the primary layer that it covers from being destroyed.

This invention relates to an improved method of applying metallic contacts to a background material. While the invention is especially useful for the application of metallic contacts to semiconductor devices, particularly transistors and diodes of the planar type, it is also applicable to the formation of metallic areas on any background material, whether electrically conductive, semiconductive or insulating. Another such application of the invention is for the formation of conducting paths in a molecular or printed circuit.

As indicated, the invention has particular application in the field of semiconductor devices. The continually decreasing size of these devices has introduced many problems to the art of establishing effective and reliable ohmic contact between very small areas on the surface of the device and the wires that lead to such areas from the exterior. In a typical planar type transistor it is necessary to establish ohmic contact with the active semiconductor surface, usually silicon or germanium, with or without doping impurities. Another problem arises in high frequency transistors where it is necessary to apply a metal film over the insulating layer (typically silicon dioxide) and to make contact between such film and an active region of the device, it being desirable to accomplish this result in a single step. This requirement calls for a metallic film having good adhesion to silicon dioxide as well as to silicon. In other applications, for example the insulated gate field effect transistor, it is desired to apply a strongly adherent film at a selected location on an insulating surface without connecting such film to any conductive portion of the device. In some cases it is desired to apply a localized metallic film to a non-conducting surface which is not necessarily part of a semiconductor device, for example, the formation of capacitors on microminiature circuits. Such localized films can be used as contacts for the establishment of electrical circuits, either by soldering wires to them, or by making pressure contact between them and other conductors, or by both methods, as convenient.

A significant feature of the present invention is that it applies essentially to the formation of one or more discreet contacts formed each at a selected location on a larger background surface. Normally no difficulty is encountered in covering an entire background surface with a conducting film, but problems arise when the need is to form individual contacts at selected locations isolated from the remainder of the surface, and these problems become more acute as the size of the contact area diminishes.

Diminishing size is characteristic of modern developments in the semiconductor art.

In the manufacture of planar type semiconductor devices, three main methods for forming ohmic contacts have evolved. The first is to evaporate the required contact metal (typically gold) through a metal foil mask that obscures the areas not to be covered. This method suffers from the disadvantage that it is difficult to avoid shadowing (spreading of the deposit under the mask) with consequent poor resolution. In addition, since the mask is a stencil, the inner parts of which must be supported from the outer parts, it is impossible to make a contact in the shape of an annulus by this method, at least in a single stage.

The second method which has been developed is the so-called "parting layer" technique in which the entire surface, except the selected contact area, is initially coated with a protective lacquer, the "parting layer," which is applied photographically. The entire outer surface is then plated with the contact metal, and then the parting layer is removed by etching with a solution that will not attack the contact metal. This process relies upon there being sufficient pin holes in the outer metal layer to allow the etchant to pass through and attack the parting layer enabling it to be lifted off the background surface carrying the overlying metal layer with it. The metal layer remains at the selected contact area, because there is here no underlying parting layer to lift it off. This method is restricted in practice to the formation of very thin metallic contacts, because thicker layers lack the necessary pin holes.

The third of the methods referred to is known as the "etch-off technique" and involves first coating the entire background surface with the contact metal and then etching off all but the contact area, the latter being masked by a photoresist during the etching step. The main disadvantage of this method is a tendency for the masked area to be undercut during the etching step. There are also problems of adhesion, namely finding a suitable metal with sufficient conductivity and strong adhesion to the background material.

The present invention provides new procedures that improve the etch-off technique and which exhibits practical advantages in relation to all three prior methods.

The invention in its preferred form consists of the following sequence of steps:

A. A layer of electrically conducting material is applied to the background surface, the inner face of this layer being highly adherent to the background surface. Preferably the inner face of this layer is constituted by a first sub-layer of titanium, chromium or Nichrome, and the remainder of the layer is preferably constituted by a second sub-layer of silver, copper, nickel or gold, the application of these sub-layers being carried out as a continuous evaporation process to cause the second material (e.g. silver) to adhere strongly to the first material (e.g. titanium).

B. The outer face of this layer is then masked to leave exposed only the selected location (or locations) where a contact is to be formed. A layer of photoresist is a convenient method of achieving this object.

C. Then a further (outer) conducting material is applied by electrodeposition onto the exposed portion (or portions) of such outer face. This outer material is preferably gold, although it may be some other metal, such as rhodium, which can readily be plated onto the silver (or copper or nickel) of said outer face, and which will resist the subsequent etching step. When the second sub-layer of the composite layer is gold, the outer conducting material cannot also be gold and rhodium can conveniently be used.

D. Finally, after removing the masking, the layer is destroyed as a conducting layer, except where it is covered by the outer conducting material. This destruction may take the form of either a full etching away of all the layer (e.g. silver and titanium) or etching of the second sub-layer (silver), with or without some etching of the first sub-layer (titanium), depending on its thickness, followed by conversion of the remaining titanium to titanium dioxide which is an excellent insulator.

The remaining metallic area or areas covered by and including the outer conducting material now comprise the desired contact or contacts.

This method has been found to have advantages over the prior methods described above, in the following respects:

There is comparative freedom from undercutting of the contact, because it is possible by the new method to make the initial layer very thin in comparison with the outer conducting material which is deposited on it. This particularly applies to the first sub-layer. For example, the first sub-layer (titanium) would be typically $10^{-2}$ microns thick and the second sub-layer (silver) would be typically $10^{-1}$ microns thick, while the thickness of the outer conducting material (gold) would be typically 0.5 to 2 microns, or as much more as might be required in any particular case. With the total layer (the two sub-layers) thickness of the order of a tenth of a micron, there will be no appreciable effect on resolution by undercutting of the etchant.

By the use of an electrodeposition step to apply the outer conducting material, the relative thicknesses cited above can be readily obtained, and, in particular, a comparatively thick outer layer of gold is obtainable. If rhodium is used instead of gold, some limitation on its thickness may be imposed by the other consideration that rhodium plates with a high tensile stress and tends to crack if plated too thickly. Thus, although rhodium has great resistance to wear, tarnishing and abrasion (for which purpose a film of rhodium may be placed on top of a basically gold contact), the material with the best all round properties is undoubtedly gold, especially in view of the manner in which it lends itself so well to the so-called thermo-compression bonding technique for joining external wires.

Another advantage of the preferred method of the present invention resides in the fact that the background surface can be thoroughly cleaned before the step of evaporating the first sub-layer onto it, since there is no photo-resist present at this time. This ability to clean the surface effectively leads to superior adhesion of the first sub-layer. Also the method permits the use of titanium, as the material of the first sub-layer, and titanium has excellent adhesion to a wide range of background materials (metallic and non-metallic, including semiconductors). Titanium has not been usable in the conventional etch-off process, because of the difficulty of removing all traces of it by normal etching methods. This problem has been avoided by the new concept of converting the titanium to its oxide. The same considerations apply when the material used for the first sub-layer is chromium, or a chromium alloy, such as Nichrome. Chromium also forms a very adherent sub-layer and can readily be oxidized into a highly insulating and consequently inert layer.

Thus the invention has a further aspect that can be defined as the improvement to the etch-off process comprising converting the exposed portion of a layer of partially masked metal (e.g. consisting essentially of titanium or chromium) to the corresponding oxide to render said portion electrically insulating.

A specific manner in which the invention may be carried into practice is illustrated diagrammatically in the accompanying drawings. These drawings illustrate the invention by way of example only, the broad scope of the invention being defined by the appended claims.

Figures 1, 2, 3, 4, 5, 6, 7:
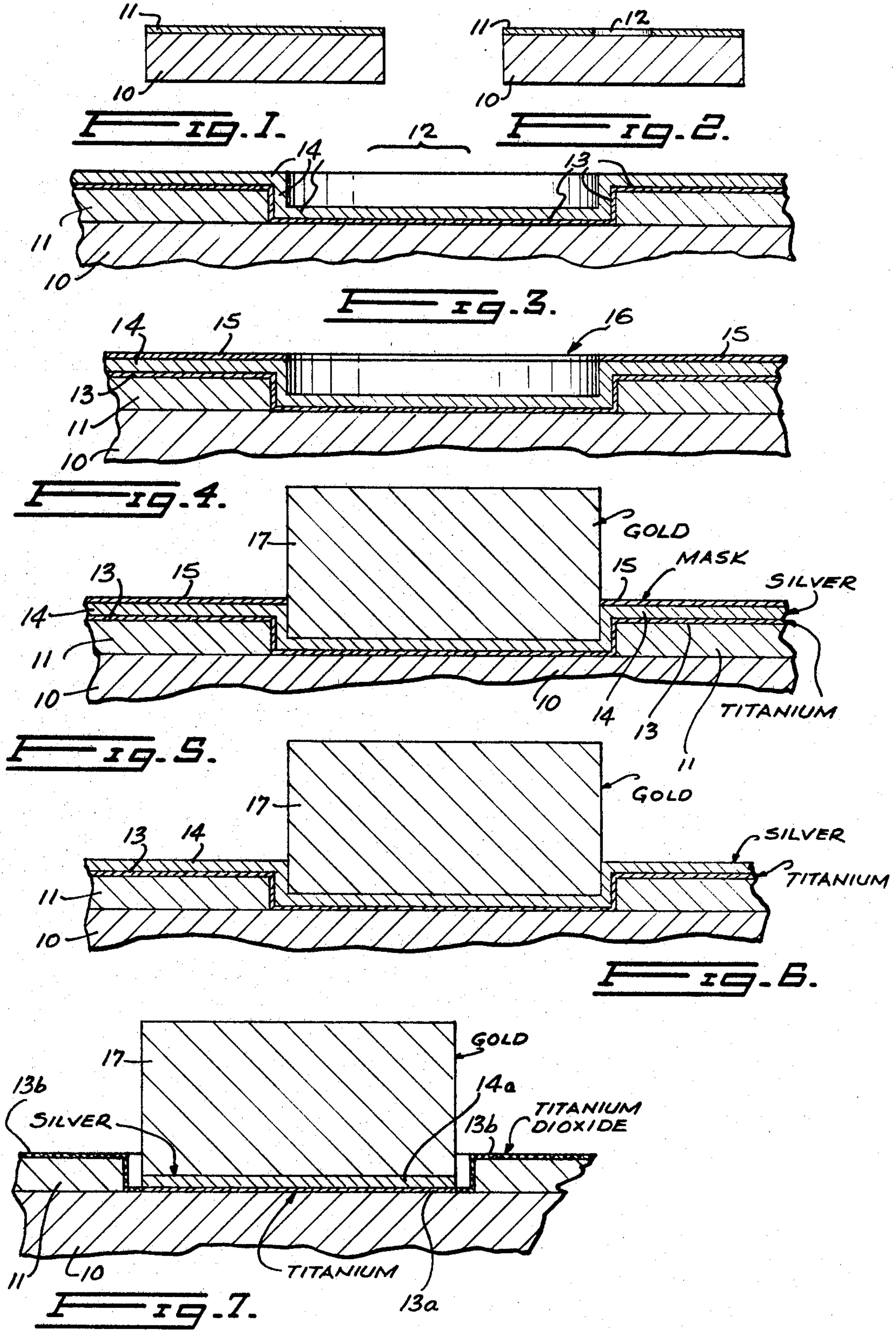
FIGURE 1 is a diagrammatic sectional view of a portion of background material demonstrating a first step in the process.
FIGURE 2 is a similar view showing the same material at a second step in the process.
FIGURES 3 to 7 are enlarged fragmentary views of a contact area of this material at subsequent stages in the process.

FIGURE 1 shows a slice of background material 10 which for the purposes of the present example will be assumed to be silicon, such as would form part of a semiconductor device such as a planar transistor. The slice is provided in the usual way with an outer insulating layer 11 which will conveniently be silicon dioxide. Assuming that this insulating layer 11 initially covers the entire upper surface of the material 10, the first step in the making of an ohmic contact with this material is to etch a window 12 in the insulating layer 11. This is done by using one of the well known photolithographic procedures. This slice is then thoroughly cleaned to prepare it for metallic deposition and the next step is to evaporate a thin sub-layer 13 of titanium over the entire exposed surface, covering both the insulating layer 11 and the window 12. This evaporation step is carried out in a high vacuum, and then a sub-layer 14 of silver is evaporated onto the titanium without intermediate breaking of the vacuum. The result is good adhesion of the silver to the titanium and the formation by the two sub-layers of a composite conducting layer, the inner face of which is highly adherent to the background material and the outer face of which is suitable as a base for a subsequent electrodeposition step. Alternatively, the evaporation of silver may be commenced before the termination of the titanium evaporation, thereby blending the two sub-layers at their interface and thus further enhancing the adhesion between these sublayers. The silver sub-layer 14 will be much thicker than the titanium sub-layer 13, typically ten times thicker, e.g. $10^{-1}$ microns of silver to $10^{-2}$ microns of titanium.

The next stage in the process is to apply by the usual method a layer 15 of photo-resist (FIGURE 4) leaving a window 16 in the photo-resist 15 in register with the window 12. Alternatively, the window 16 may overlie the insulating layer 11. The slice is then plated with gold 17 by electro-deposition in the area where a metallic contact is finally desired, namely in the area 16 (FIGURE 5). Electroplating is carried out using a plating bath having a pH close to 7. It is desirable to avoid a conventional strongly alkaline gold-plating bath, since it would tend to attack and lift the photoresist.

The photoresist 15 is then removed by conventional means, exposing the silver and titanium sub-layers 14 and 13 in those areas where metallic contacts are not required. This is shown in FIGURE 6. The sub-layers in the contact area, however, are now protected by the covering of gold 17. The unprotected silver sub-layer 14 is now etched away by an etchant that will not attack the gold.

The slice is then heated in an oxygen atmosphere at an elevated temperature (typically 350° C.) for about 15 minutes, causing the full depth of the exposed areas of titanium sub-layer to become oxidized and converted to an electrically insulating layer **13*b*** of titanium dioxide.

If a comparatively thick layer of titanium had been originally deposited, oxidation time might be greater than 15 minutes. To reduce oxidation time and ensure oxidation of the full depth of titanium it would be advantageous in such a case particularly to etch away part of the titanium layer in aqueous hydrochloric acid and then to convert the remainder of the layer to the oxide. Since it has been found to be difficult to remove all traces of titanium by etching, it is necessary to oxidize the slice in the manner already described, such procedure being carried out either directly or after a preliminary etching process.

The portion **13*a* of the titanium and the portion 14*a* of the silver are protected by the covering of gold 17 and thus remain unchanged and fully electrically conducting to establish electrical contact between the material 10** and the external contact constituted by the outer covering of gold 17. In the case where the window 16 and hence the gold 17 are not in register with a window 12, the composite contact 17, 14*a*, 13*a* forms an electrically conducting overlay on the insulating layer 11.

I claim:

1. A method of forming a metallic contact at a selected location on a background surface, comprising (a) applying to said surface a layer of electrically conducting material, said layer being built up of a pair of sub-layers by applying to said background surface a first sub-layer of a first electrically conducting material that is highly adherent to said surface, and applying over said first sub-layer a second sub-layer of an electrically conducting material that is suitable as a base for electrodeposition of a further conducting material, the application of said sub-layers being carried out as a continuous evaporation process, (b) masking the outer face of said layer to leave exposed the selected location thereof, (c) then depositing said further conducting material on the exposed portion of said outer face, (d) and finally destroying said layer as a conducting layer, except where covered by said further conducting material, by etching away at least the outer part of said layer and converting any remaining part to an electrically nonconducting layer, with said further conducting material remaining as at least a part of said contact.

2. A method according to claim 1, wherein said continuous evaporation process is carried out by commencing evaporation of the material of said second sub-layer before terminating evaporation of the material of said first sub-layer to cause said second material to blend gradually into said first material.

3. A method according to claim 1, wherein said first material essentially consists of a metal selected from the group consisting of titanium and chromium.

4. A method according to claim 1, wherein said second material consists essentially of a metal selected from the group consisting of silver, copper, nickel and gold.

5. A method according to claim 1, wherein said first material is titanium and said second material is silver.

6. A method according to claim 5 wherein said step (d) is carried out by (e) etching away at least the portion of said layer constituted by said silver, by etching means to which said further conducting material is resistance, (f) and converting the remaining titanium to titanium dioxide.

7. A method according to claim 6, wherein said further conducting material consists essentially of a metal selected from the group consisting of gold and rhodium.

8. A method according to claim 1, wherein the ratio of the thickness of said first sub-layer to the thickness of said second sub-layer is of the order of 1 to 10.

9. A method according to claim 8 wherein the thickness of said further conducting material is substantially thicker than the combined thicknesses of said sub-layers.

10. A method of forming a metallic contact at a selected location on a background surface, comprising (a) evaporating onto said surface a first sub-layer of titanium, (b) evaporating onto said first sub-layer a second sublayer of silver, (c) said evaporating steps being carried out as a continuous evaporation process, (d) masking the outer face of said silver to leave exposed the selected location thereof, (e) then electrodepositing a layer of gold onto the exposed portion of said silver, (f) removing the masking and etching away the silver except where covered by said gold, (g) and finally converting the titanium to titanium dioxide except where covered by said gold and the remaining silver.

11. A method according to claim 10, wherein said continuous evaporation process is carried out by commencing evaporation of the silver before terminating evaporation of the titanium to cause the silver and titanium to blend gradually into each other.

References Cited

UNITED STATES PATENTS

| | | | |
|---|---|---|---|
| 3,169,892 | 2/1965 | Lemelson | 117—217 X |
| 3,296,574 | 1/1967 | Tassara | 117—215 X |

ALFRED L. LEAVITT, *Primary Examiner.*

ALAN GRIMALDI, *Assistant Examiner.*